United States Patent
Holmes et al.

(10) Patent No.: US 12,342,732 B2
(45) Date of Patent: *Jun. 24, 2025

(54) VERTICAL SILICON JOSEPHSON JUNCTION DEVICE FOR QUBIT APPLICATIONS

(71) Applicant: INTERNATIONAL BUSINESS MACHINES CORPORATION, Armonk, NY (US)

(72) Inventors: Steven J. Holmes, Ossining, NY (US); Devendra K. Sadana, Pleasantville, NY (US); Oleg Gluschenkov, Tannersville, NY (US); Stephen W. Bedell, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/564,122

(22) Filed: Dec. 28, 2021

(65) Prior Publication Data

US 2023/0210018 A1   Jun. 29, 2023

(51) Int. Cl.
*H10N 60/12* (2023.01)
*G06N 10/00* (2022.01)
(Continued)

(52) U.S. Cl.
CPC ............. *H10N 60/12* (2023.02); *G06N 10/00* (2019.01); *H10N 60/0912* (2023.02);
(Continued)

(58) Field of Classification Search
CPC .. H10N 60/12; H10N 60/0912; H10N 60/805; H10N 60/85; H10N 69/00; G06N 10/00; G06N 10/40
See application file for complete search history.

(56) References Cited

U.S. PATENT DOCUMENTS 7,126,180 B2   10/2006   Park
7,777,343 B2    8/2010   Noguchi et al.
(Continued)

FOREIGN PATENT DOCUMENTS

AU   2021211858 A1   6/2022
CN    109285942 A    1/2019
(Continued)

OTHER PUBLICATIONS

Chiodi et al. "All silicon Josephson Junction," arXiv: 1610.08453v1 (Year: 2016).*

(Continued)

*Primary Examiner* — Matthew L Reames
(74) *Attorney, Agent, or Firm* — Intelletek Law Group, PLLC; Gabriel Daniel, Esq.

(57) ABSTRACT

A vertical Josephson Junction (JJ) qubit device that is fabricated from crystalline silicon material is provided. The JJ device has a substrate of epitaxial silicon, a lower superconducting electrode that is a superconducting region of the epitaxial silicon and an upper superconducting electrode of a metallic superconductor. The JJ device also has a junction layer. A section of the junction layer between the lower and upper superconducting electrodes forms a junction of the JJ device. Resonator and/or capacitor wiring of the JJ device is also fabricated using the metallic superconductor. The superconducting region is epitaxial silicon that is doped or implanted with boron or gallium. The substrate, the junction layer, and the implanted epitaxial silicon share a contiguous crystalline structure.

19 Claims, 6 Drawing Sheets

(51) Int. Cl.
  *H10N 60/01* (2023.01)
  *H10N 60/80* (2023.01)
  *H10N 60/85* (2023.01)
  *H10N 69/00* (2023.01)

(52) U.S. Cl.
  CPC ........... *H10N 60/805* (2023.02); *H10N 60/85* (2023.02); *H10N 69/00* (2023.02)

(56) References Cited

U.S. PATENT DOCUMENTS

| | | | |
|---|---|---|---|
| 9,076,680 | B2 | 7/2015 | Busch et al. |
| 9,882,113 | B1 | 1/2018 | Henry |
| 10,037,493 | B2 | 7/2018 | Harris et al. |
| 10,097,143 | B2 | 10/2018 | Abdo |
| 10,256,392 | B1 | 4/2019 | Brink et al. |
| 10,367,133 | B1 | 7/2019 | Tahan |
| 10,903,411 | B2 | 1/2021 | Marcus et al. |
| 11,107,968 | B1 | 8/2021 | Holmes et al. |
| 11,411,160 | B2* | 8/2022 | Holmes .............. H10N 60/0912 |
| 2004/0056335 | A1 | 3/2004 | Aoyagi et al. |
| 2008/0318411 | A1 | 12/2008 | Tsutsue |
| 2014/0306344 | A1 | 10/2014 | Sugawa et al. |
| 2015/0179916 | A1 | 6/2015 | Pramanik et al. |
| 2016/0148112 | A1 | 5/2016 | Kwon |
| 2016/0343894 | A1 | 11/2016 | Shim et al. |
| 2019/0220769 | A1 | 7/2019 | Pikulin |
| 2019/0296210 | A1* | 9/2019 | Brink .................... H01P 11/003 |
| 2020/0006619 | A1 | 1/2020 | Fuhrer et al. |
| 2020/0328339 | A1 | 10/2020 | Shabani et al. |
| 2021/0226114 | A1* | 7/2021 | Holmes ................ H10N 60/126 |

FOREIGN PATENT DOCUMENTS

| | | |
|---|---|---|
| CN | 115023818 A | 9/2022 |
| EP | 4094301 A1 | 11/2022 |
| JP | S57-153481 A | 9/1982 |
| JP | 2004-128437 A | 4/2004 |
| JP | 6444089 B2 | 12/2018 |
| JP | 2023-510225 A | 3/2023 |
| WO | 2021/148331 A1 | 7/2021 |

OTHER PUBLICATIONS

Chiodi, F. et al., "All Silicon Josephson Junctions"; arXiv:1610.08453v1 (2016), 6 pgs.
Wen, F. et al., "Josephson Junction Field-Effect Transistors for Boolean Logic Cryogenic Applications"; IEEE Transactions on Electron Devices (2019); vol. 66:12; pp. 5367-5374.
Thorgrimsson, B. et al., "The Effect of External Electric Fields on Silicon With Superconducting Gallium Nano-Precipitates"; arXiv:1911.06931v1 (2019); 11 pgs.
Grockowiak, A. et al., "Superconducting Properties of Laser Annealed Implanted Si:B Epilayers"; Superconductor Science and Technology (2013); vol. 26, 4 pp.
Shim, Y. et al. "Bottom-Up Superconducting and Josephson Junction Devices Inside A Group-IV Semiconductor"; Nature Communications (2014); 8 pgs.
Hoummada, K. et al., "Absence of Boron Aggregates in Superconducting Silicon Confirmed by Atom Probe Tomography"; Applied Physics Letters, American Institute of Physics (2012); 5 pgs.
Bustarret, E., et al., "Superconductivity in Doped Semiconductors"; Elsevier (2015); vol. 514, 27 pgs.
Bustarret, E., et al., "Superconductivity in Doped Cubic Silicon"; Nature Letters (2006); vol. 444; 4 pgs.
Bagraeva, N.T. et al., "Superconducting Properties of Silicon Nanostructures"; Semiconductors (2009); vol. 43:11, pp. 1441-1454.
List of IBM Patents or Patent Applications Treated as Related, 2 Pgs.
Chiodi F. et al., Proximity-Induced Superconductivity in All-Silicon Superconductor /Normal-Metal Junctions, Physical Review B, Jul. 1, 2017, vol. 96, 8 pages.
Chiodi, F., et al., Gas Immersion Laser Doping for Superconducting Nanodevices, Applied Surface Science, May 30, 2014, vol. 302, pp. 209-212.
Drake, et al., Mo(x)Si(l-x) Base Electrodes for Josephson Junctions, Ip.Com, Sep. 1, 1978, 2 pages, XP013059719, ISSN: 1533-0001.
International Search Report and Written Opinion for International Application No. PCT/EP2021/050860 dated Jun. 22, 2021, 9 pages.
Japanese Patent Office, "Notice of Refusal", Jul. 23, 2023, 5 pages, Japanese Application No. 2022-541013.
Marcenat, et al., "Low-Temperature Transition to a Superconducting Phase in Boron-Doped Silicon Films Grown on K001)-Oriented Silicon Wafers." Physical Review B 81, 2010, 4 pages.
Nomura, et al., Fabrication of a Hermetic Sealing Device Using Low Temperature Intrinsic-Silicon/Glass Bonding, International Conference on Electronics Packaging and iMAPS All Asia Conference (ICEP-IAAC), Apr. 14-17, 2015, pp. 444-447.
Schebaum, O., et al., Direct Measurement of the Spin Polarization of Co2feal in Combination With MGO Tunnel Barriers 11 , Journal of Applied Physics, , May 12, 2010, vol. 107, No. 9. 4 pages.
The Australia Patent and Trademark Office, "Examination Report", Apr. 3, 2023, 3 pages, Australian Application No. 2021211858.
Japanese Patent and Trademark Office, "Notice of Reasons for Refusal" Japanese Patent Application No. 2022-541013, Jul. 23, 2024, 5 pages.
Japanese Patent and Trademark Office, "Notice of Reasons for Refusal" Japanese Patent Application No. 2022-541013, Nov. 5, 2024, 5 pages.
Japanese Patent and Trademark Office, "Notice of Reasons for Refusal", Japanese Patent Application No. 2022-541013, Mar. 4, 2025, 3 pages.

* cited by examiner

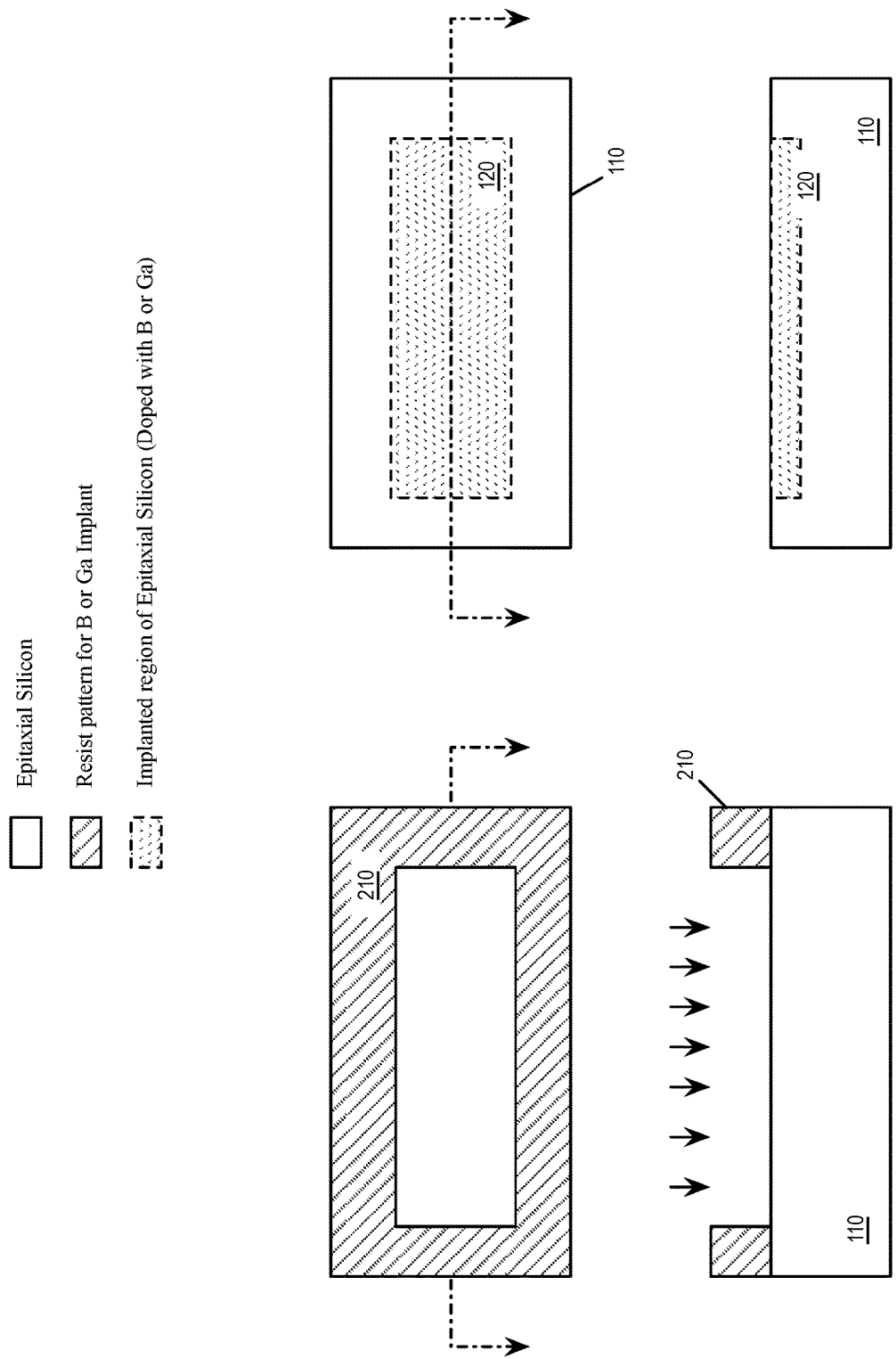

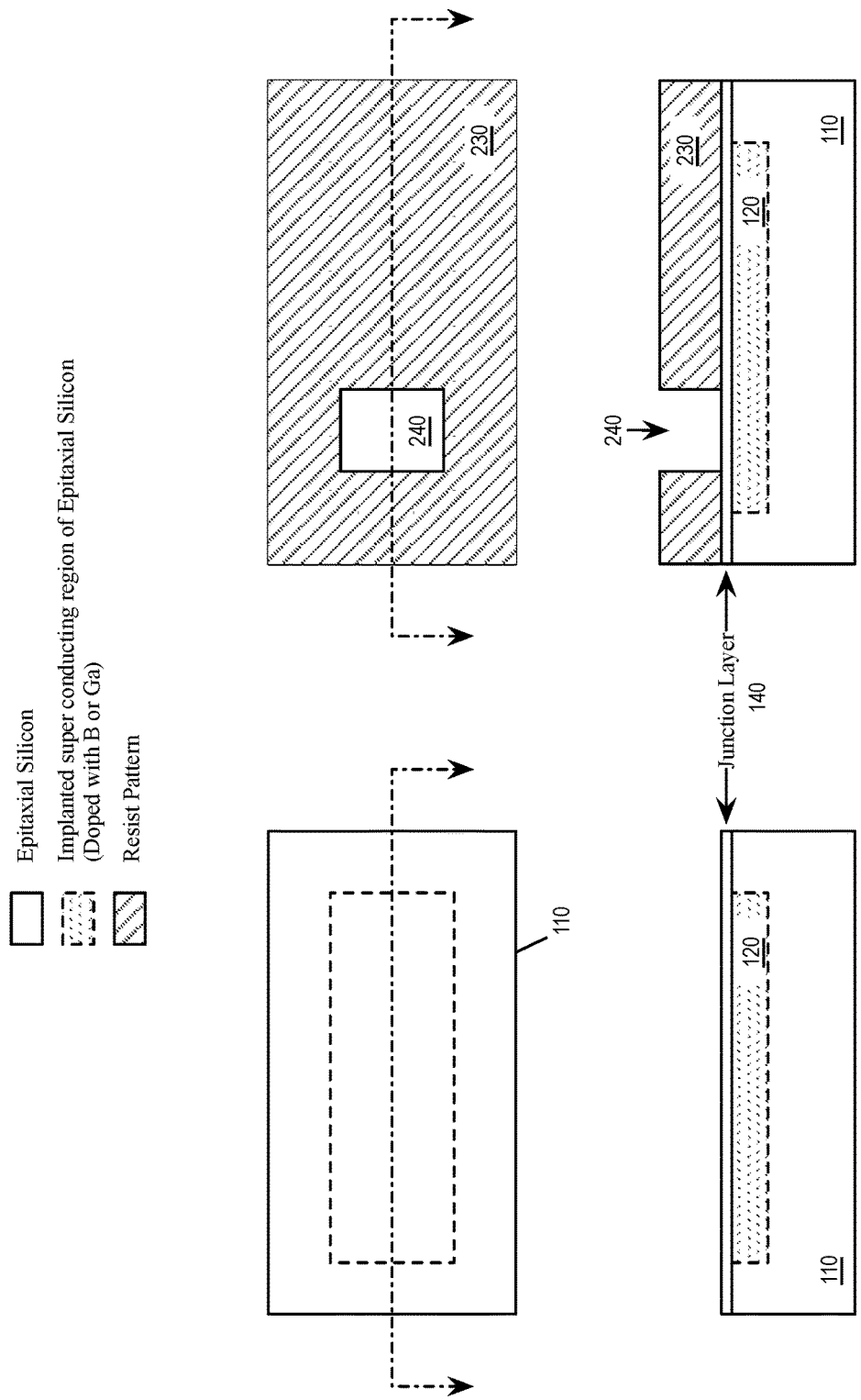

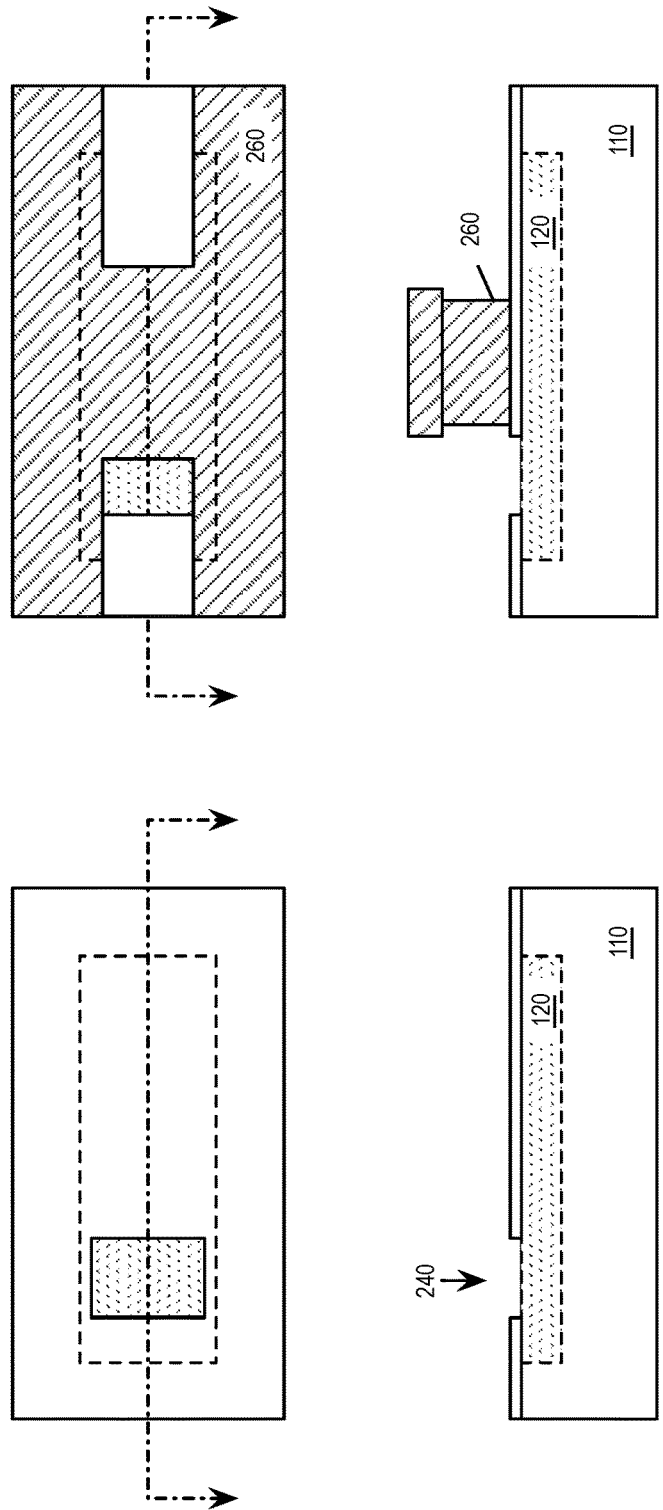

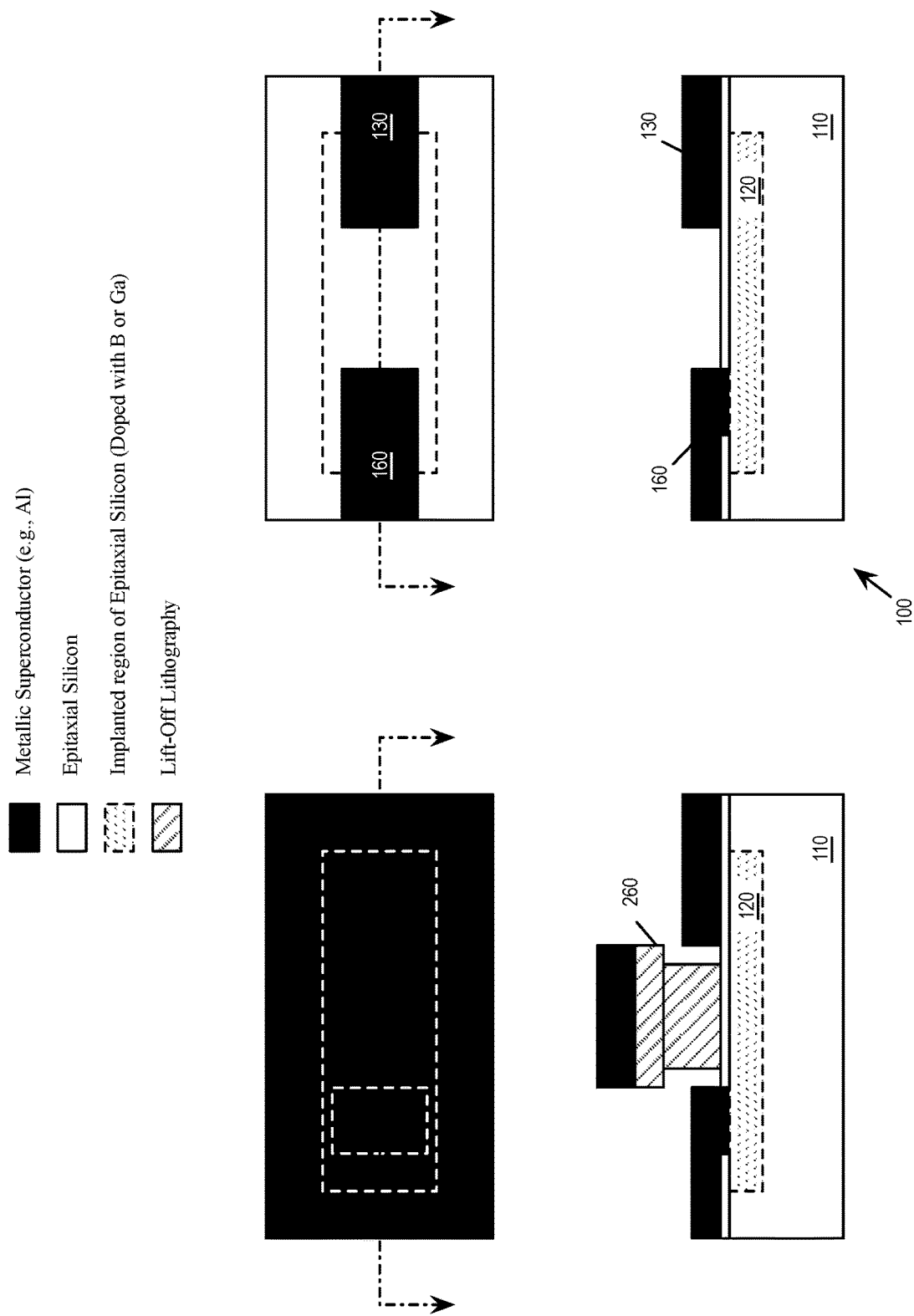

VERTICAL SILICON JOSEPHSON JUNCTION DEVICE FOR QUBIT APPLICATIONS

BACKGROUND

Technical Field

The present disclosure generally relates to fabrication of semiconductor devices, and more particularly, to superconducting devices for quantum computing.

Description of the Related Arts

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state. Various quantum phenomena, such as superposition and entanglement, do not have analogs in the world of classical computing and therefore may involve special structures, techniques, and materials.

In superconducting quantum computing, a qubit is a typically a device based on a superconductor-insulator-superconductor (SIS) Josephson Junction (JJ). There are several different types of superconducting quantum bits such as phase qubits, charge qubits, transmon qubits and fluxonium qubits, all based around the Josephson junction. Such a superconducting device is also referred to as a JJ qubit device. A Josephson Junction utilizes the Josephson effect, which is a phenomenon that occurs when two superconductors are placed in proximity, with some barrier or restriction between them. It is an example of a macroscopic quantum phenomenon, where the effects of quantum mechanics are observable in the collective phase of a large ensemble of Cooper-pairs, rather than at an atomic scale.

SUMMARY

Some embodiments of the disclosure provide a vertical Josephson Junction (JJ) qubit device that is fabricated from crystalline silicon material. The JJ device has a substrate of epitaxial silicon, a lower superconducting electrode that is a superconducting region of the epitaxial silicon, and an upper superconducting electrode that is an elemental or metallic superconductor. The JJ device also has a junction layer. A section of the junction layer between the lower and upper superconducting electrodes forms a junction of the JJ device. Resonator and/or capacitor wiring of the JJ device is also fabricated using the metallic superconductor. The superconducting region is boron or gallium doped epitaxial silicon. The substrate, the junction layer, and the implanted epitaxial silicon of the lower super conducting electrode share a contiguous crystalline structure.

Some embodiments provide a process for fabricating the vertical JJ qubit device. The process implants or dopes a substrate with boron or gallium to form a superconducting region as a lower electrode of the superconducting device. The process grows epitaxial silicon over the substrate and the doped superconducting region as a junction layer of the superconducting device. The process deposits a metallic superconductor at the substrate over the junction layer as an upper electrode of the superconducting device. Resist may be applied to form patterns of regions of the epitaxial silicon substrate to define the superconducting region. In some embodiments, the junction layer is grown in temperature less than 500 degree Celsius. The epitaxial silicon of the junction layer may be the same material as the substrate, typically monocrystalline silicon, or another type of material with specific desirable qualities. The metallic superconductor may be aluminum or another elemental superconductor such as Molybdenum, Niobium, Tin, Thallium, Titanium, Vanadium, etc. In some embodiments, the metallic superconductor is deposited to form a resonator and/or capacitor and a wire. The process may apply resist to form patterns of regions of the epitaxial silicon substrate to define contact openings to the superconducting region and perform reactive-ion etching (ME) to remove the grown epitaxial silicon at the contact openings. The metallic superconductor may be deposited over a lift-off lithography stack and the contact openings for forming pattern for the resonator and/or capacitor and the wire.

The preceding Summary is intended to serve as a brief introduction to some embodiments of the disclosure. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a Summary, Detailed Description and the Drawings are provided. Moreover, the claimed subject matter is not to be limited by the illustrative details in the Summary, Detailed Description, and the Drawings, but rather is to be defined by the appended claims, because the claimed subject matter can be embodied in other specific forms without departing from the spirit of the subject matter.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

FIG. 2A shows the substrate of epitaxial silicon and a pattern of resist over the substrate defining a region for implant.

FIG. 2B shows B or Ga implanted onto the substrate at the region defined by the resist.

FIG. 2C shows a layer of epitaxial silicon being grown over the substrate, including over the implanted superconducting region.

FIG. 2D shows resist being applied to the substrate over the epitaxial layer to form pattern for creating contact openings, including a contact opening.

FIG. 2E shows etching process being applied to remove the grown epitaxial silicon at the contact openings defined by the resist pattern.

FIG. 2F shows lift-off lithography stack being applied to the substrate to define pattern for the upper electrode and wiring.

FIG. 2G shows metal being deposited over the lift-off lithography stack, including over contact openings.

FIG. 2H shows the lithography stack being lifted off, leaving upper electrode and wiring in contact with the implanted region as the lower electrode.

DETAILED DESCRIPTION

Figure 1:
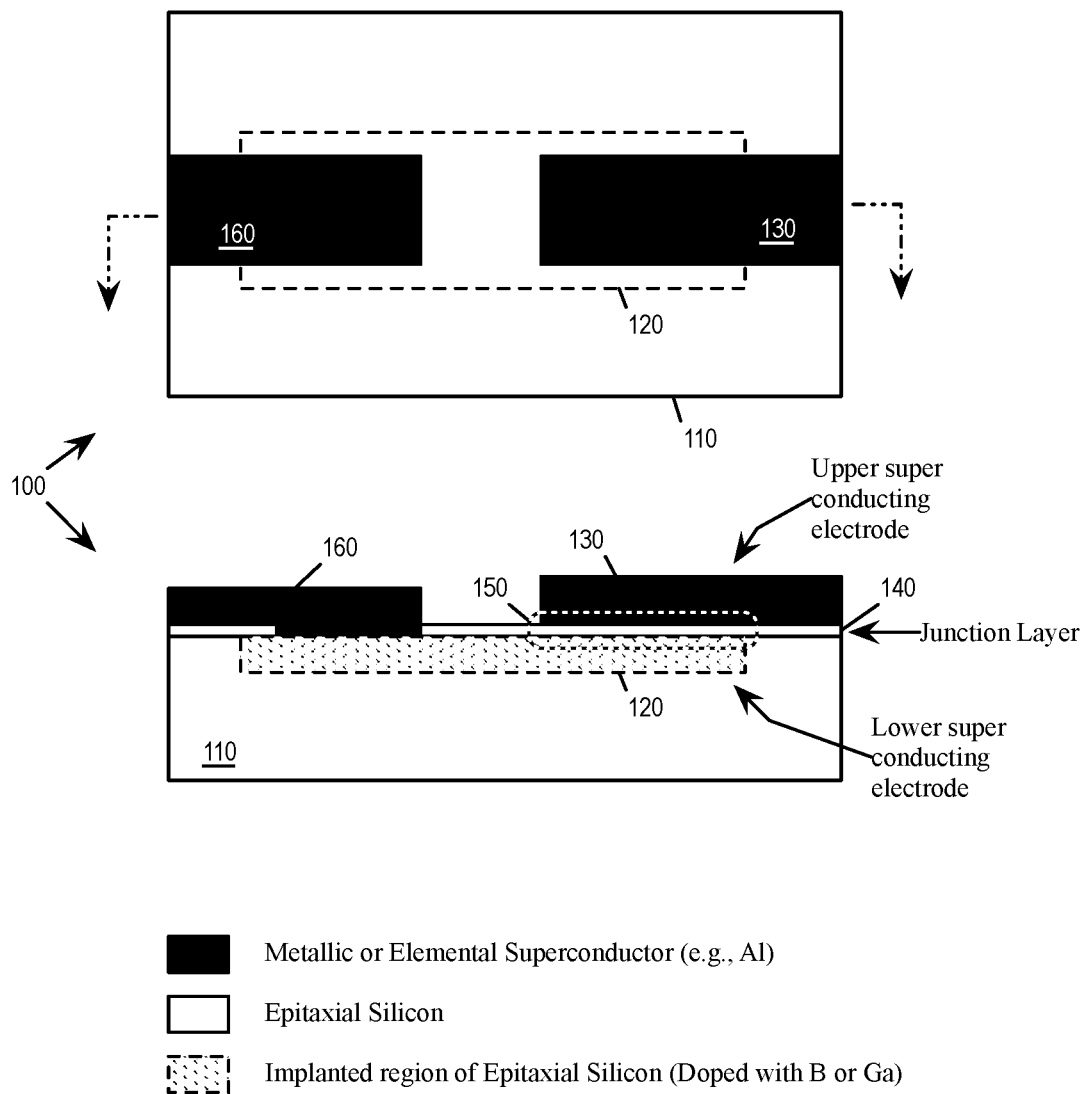
FIG. 1 illustrates an example vertical JJ qubit device that is fabricated from crystalline silicon material.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

There are three types of doped-semiconductor material that behave drastically different at low temperatures: (i) a doped semiconductor that becomes insulator at low temp; (ii) a doped semiconductor that continues to be conductive at low temp; and (iii) a special highly doped semiconductor that becomes superconducting at low temp. The normal doped semiconductor has dopant and holes concentration from about $1\times10^{19}/cm^3$ to about $3\times10^{20}/cm^3$. The doped semiconductor (that becomes insulator at low temp) has dopant and holes concentration below $1\times10^{19}/cm^3$.

The superconducting dopant-semiconductor alloy is typically only possible for p-type dopants. For Silicon (Si), Silicon-Germanium (SiGe), or Silicon-Germanium-Tin (SiGeSn) semiconductors, the corresponding p-type dopants are Boron (B), Aluminum (Al), Gallium (Ga), and Indium (In). For pure Si, B may be preferred due to its high solid solubility in Si. For SiGe, a mixture of B, Al, Ga can be used. For pure Ge, Al or Ga may be preferred due to their high solid solubility in Ge. These superconducting materials are "metastable," meaning that the concentration of homogeneously distributed dopants in the crystal lattice exceeds the maximum solid solubility of such dopant in particular host semiconductor. The excess amount of dopants (in excess of solid solubility at a particular temperature) will precipitate out, forming clusters/inclusions when annealed, which is not desirable. Hence, these materials are created using non-equilibrium, kinetic growth techniques, such as gas phase, solid phase, or liquid phase epitaxy. Solid and liquid phase epitaxy may employ amorphization by ion implanter and short-scale (from nanosecond to millisecond) laser annealing to re-grow of reform the material. Once formed, the metastable alloys are to be preserved, minimizing any prolonged exposure (e.g., minutes) to elevated temperature (e.g., above 400° C.). The concentration of free holes in such materials exceeds $5\times10^{20}$ holes/$cm^3$ and often exceeds $1\times10^{21}$ holes/$cm^3$. Abundance of free holes making such material superconducting at a low temperature.

A vertical Josephson Junction (JJ) device may have a vertical structure of (iii)-(ii)-(i)-(ii)-(iii) layers. The (ii) layer is to be minimized but never reach zero due to a finite vertical abruptness of p-type dopants. In other words, in one aspect, the dopant abruptness is to be improved down to less than 1-2 nm/decade (lower being better as it is more abrupt), which put certain limits of how these doped layers are created and what processes are allowed afterwards to keep the abruptness in check to minimize dopant diffusion.

In most Josephson Junction (JJ) devices the electrodes are formed by a convectional low temperature superconductor and the tunnel barrier is formed by a metal oxide (most common is $Al_2O_3$). Some embodiments of the disclosure provide a vertical JJ qubit device that is fabricated from crystalline silicon material. In some embodiments, such a JJ qubit device is fabricated with epitaxial silicon as the junction material, doped epitaxial silicon as a lower superconducting electrode, and metallic superconductor as an upper electrode. Defect is minimized because the substrate, the epitaxial silicon of the junction layer, and the doped epitaxial silicon of the lower super conducting electrode share a contiguous crystalline structure. In some embodiments, resonator and/or capacitor of the JJ device is also fabricated using the metallic superconductor. In some embodiments, the doped epitaxial silicon is implanted with gallium or boron.

FIG. 1 illustrates an example vertical JJ qubit device 100 that is fabricated from crystalline silicon material. The figure shows a top plan view and a cross section view of the JJ qubit device 100. As illustrated, the vertical JJ device 100 a superconducting device that includes a substrate of epitaxial silicon 110, a lower superconducting electrode 120 that is a superconducting region 115 of the epitaxial silicon, and an upper superconducting electrode 130 that is a metallic superconductor. The device 100 also includes a junction layer 140. A section 150 of the junction layer 140 between the lower and upper superconducting electrodes forms a junction of the JJ qubit device 100.

The superconducting region 115 may be fabricated by doping the substrate 110 with boron or gallium (so the superconducting region 115 is also referred to as the implanted region or the doped region of the epitaxial silicon substrate). The junction layer 140 is a layer of epitaxial silicon grown over the superconducting region 115 of the epitaxial silicon substrate. In some embodiments, the epitaxial silicon of the junction layer is grown in temperature less than 500 degree Celsius. In some embodiments, the junction layer 140 has a same crystalline (monocrystalline) structure as the substrate 110. In some other embodiments, the junction layer is a layer of dielectric (e.g., Silicon Germanium, Silicon Oxide, Aluminum Oxide, etc.).

The metallic superconductor used to form the upper electrode 130 may be aluminum or another elemental superconductor (e.g., Mercury, Molybdenum, Niobium, Lead, Tin, Thallium, Titanium, Vanadium, etc.). The metallic conductor may also be used to form a wiring for a capacitor or resonator in the device 100. For example, the metallic conductor forms a wire 160 that is in contact with the lower superconducting electrode 120. Superconducting resonators have multitude of applications in superconducting quantum circuits, such as readout and qubit coupling.

FIGS. 2A-2H illustrates stages of fabricating the example vertical JJ qubit device 100. Each figure shows a top plan view and a frontal cross section view of the device.

FIG. 2A shows the substrate of epitaxial silicon 110 and a pattern of resist 210 over the substrate defining a region for implant. FIG. 2B shows B or Ga implanted onto the substrate at the region defined by the resist (and with the resist removed). The implanted region forms a superconducting region to be lower electrode 120. The implanted B or Ga is then annealed into the silicon substrate.

FIG. 2C shows a layer of epitaxial silicon being grown over the substrate 110, including over the implanted superconducting region. This layer of epitaxial silicon is to be the junction layer 140. In some embodiments, the layer of epitaxial silicon is grown at low temperature (e.g., <500° C.). The grown epitaxial silicon 140 may have a same crystalline structure as the substrate 110.

FIG. 2D shows resist 230 being applied to the substrate over the epitaxial layer to form pattern for creating contact openings, including a contact opening 240. FIG. 2E shows etching process being applied to remove the grown epitaxial silicon at the contact openings defined by the resist pattern. The contact opening 240 now exposes the implanted region 120 for metallic contact. The resist material is removed. In some embodiments, the etching process is reactive-ion etching (RIE), which is an etching technology used in microfabrication. RIE uses chemically reactive plasma to remove material deposited on wafers. The plasma is generated under low pressure (e.g., vacuum) by an electromagnetic field. High-energy ions from the plasma attack the wafer surface and react with it.

FIG. 2F shows lift-off lithography stack 260 being applied to the substrate (over the epitaxial silicon layer and contact openings) to define pattern for the upper electrode 130 and wiring. Lift off lithography or lift-off process is a method of creating structures (patterning) of a target material on the surface of a substrate using a sacrificial material (e.g., photoresist). It is an additive technique as opposed to more subtracting technique like etching.

FIG. 2G shows metal being deposited over the lift-off lithography stack, including over contact openings. FIG. 2H shows the lithography stack 260 being lifted off, leaving upper electrode 130 and wiring 160 in contact with the implanted region 120 as the lower electrode. A Josephson Junction is formed at the junction layer between the upper electrode 130 and the lower electrode.

Figure 3:
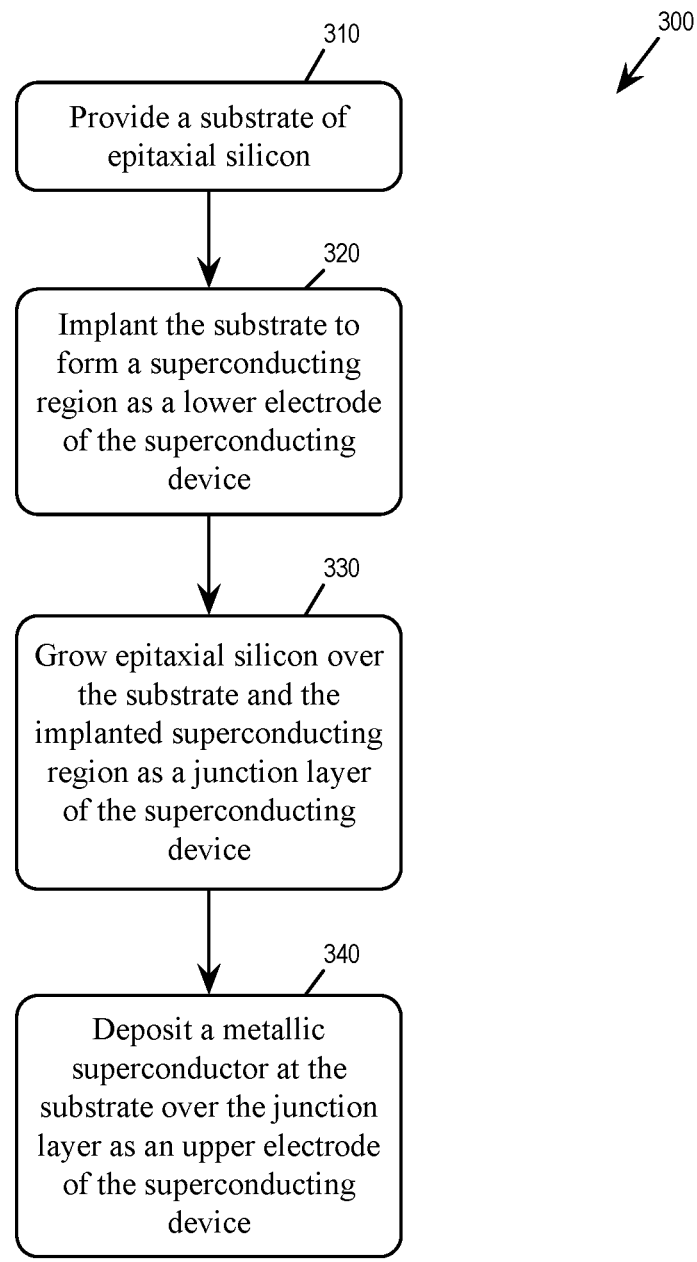
FIG. 3 conceptually illustrates a process for fabricating a vertical JJ qubit device.

FIG. 3 conceptually illustrates a process 300 for fabricating a vertical JJ qubit device, consistent with an illustrative embodiment. In some embodiments, one or more semiconductor manufacturing equipment are used to perform the process 300.

At block 310, the process provides a substrate of epitaxial silicon. Epitaxy refers to a type of crystal growth or material deposition in which new crystalline layers are formed with one or more well-defined orientations with respect to the crystalline seed layer. The substrate may be a slice of an epitaxial silicon wafer, which is a wafer of semiconducting material made by epitaxial growth for use in microelectronics.

At block 320, the process implants or dopes the substrate with boron or gallium to form a superconducting region as a lower electrode of the superconducting device. The process may apply resist to form patterns of regions of the epitaxial silicon substrate to define the superconducting region. Implanting the substrate to form a superconducting region is described above by reference to FIGS. 2A-B.

At block 330, the process grows epitaxial silicon over the substrate and the doped superconducting region as a junction layer of the superconducting device. In some embodiments, the junction layer is grown in temperature less than 500 degree Celsius. The epitaxial silicon of the junction layer may be the same material as the substrate, typically monocrystalline silicon, or another type of material with specific desirable qualities. Growing the junction layer is described above by reference to FIG. 2C.

At block 340, the process deposits a metallic superconductor at the substrate over the junction layer as an upper electrode of the superconducting device. The metallic superconductor may be aluminum or another elemental superconductor such as Mercury, Molybdenum, Niobium, Lead, Tin, Thallium, Titanium, Vanadium, etc. In some embodiments, the metallic superconductor is deposited to form a resonator and/or capacitor and a wire. The process may apply resist to form patterns of regions of the epitaxial silicon substrate to define contact openings to the superconducting region and perform reactive-ion etching (ME) to remove the grown epitaxial silicon at the contact openings. Etching for contact openings is described above by reference to FIG. 2D-E. The metallic superconductor may be deposited over a lift-off lithography stack and the contact openings for forming pattern for the resonator and/or capacitor and the wire. Depositing superconductors is described above by reference FIG. 2F-H.

The flowchart in FIG. 3 illustrates the operation of possible implementations of systems, methods, and computer program products according to various embodiments of the present disclosure. In this regard, each block in the flowchart may represent a module, segment, or portion of instructions for implementing the specified operation(s). In some alternative implementations, the operations noted in the blocks may occur out of the order noted in the FIG. 3. For example, two blocks shown in succession may, in fact, be executed substantially concurrently, or the blocks may sometimes be executed in the reverse order, depending upon the operations involved.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A vertical Josephson Junction device comprising:
   a substrate comprising an epitaxial silicon;
   a lower superconducting electrode comprising a superconducting region of the epitaxial silicon;
   an upper superconducting electrode comprising a metallic superconductor; and
   a junction layer, wherein:
     a section of the junction layer between the lower and upper superconducting electrodes forms a junction of the vertical Josephson Junction device; and
     the substrate, the lower superconducting electrode, and the junction layer have a same crystalline structure.

2. The device of claim 1, wherein the superconducting device is a vertical Josephson Junction (JJ) qubit device.

3. The device of claim 1, wherein the junction layer is a layer of epitaxial silicon grown over the superconducting region of the epitaxial silicon.

4. The device of claim 1, wherein the junction layer is a layer of dielectric.

5. The device of claim 1, wherein the superconducting region is fabricated by implanting the substrate with boron or gallium.

6. The device of claim 1, wherein the metallic superconductor comprises a resonator and a wire.

7. The device of claim 1, further comprising a wire in contact with the lower superconducting electrode, the wire comprising the metallic superconductor.

8. The device of claim 1, wherein the junction layer is epitaxial silicon grown at a temperature less than 500 degree Celsius.

9. The device of claim 1, wherein the metallic superconductor comprises aluminum.

10. A method of fabricating a superconducting device, comprising:

providing a substrate of epitaxial silicon;

doping the substrate to form a superconducting region as a lower electrode of the superconducting device;

growing epitaxial silicon over the substrate and the doped superconducting region as a junction layer of the superconducting device; and depositing a metallic superconductor at the substrate over the junction layer as an upper electrode of the superconducting device.

11. The method of claim 10, wherein the superconducting region is doped with boron or gallium.

12. The method of claim 10, wherein the substrate, the superconducting region, and the junction layer share a contiguous crystalline structure.

13. The method of claim 10, wherein the junction layer is epitaxial silicon grown at a temperature less than 500 degree Celsius.

14. The method of claim 10, further comprising patterning regions of the epitaxial silicon substrate with resist to define contact openings to the superconducting region.

15. The method of claim 14, further comprising performing reactive-ion etching (RIE) to remove the grown epitaxial silicon at the defined contact openings.

16. The method of claim 15, wherein the metallic superconductor is deposited over a lift-off lithography stack and the contact openings to form a pattern for a resonator and a wire for the resonator.

17. A method of fabricating a superconducting device, comprising:

providing a substrate of epitaxial silicon;

doping the substrate to form a superconducting region as a lower electrode of the superconducting device;

depositing a dielectric layer over the substrate and the doped superconducting region as a junction layer of the superconducting device; and depositing a metallic superconductor at the substrate over the junction layer as an upper electrode of the superconducting device.

18. The method of claim 17, wherein the superconducting region is doped with boron or gallium.

19. The method of claim 17, wherein the metallic superconductor comprises aluminum.

\* \* \* \* \*